United States Patent [19]

Troyon

[11] Patent Number: 4,825,080
[45] Date of Patent: Apr. 25, 1989

[54] ELECTRICAL PARTICLE GUN

[75] Inventor: Michel Troyon, Gueux, France

[73] Assignee: Universite de Reims Champagne-Ardenne, France

[21] Appl. No.: 100,094

[22] Filed: Sep. 23, 1987

[51] Int. Cl.$^4$ .............................................. H01J 37/00
[52] U.S. Cl. .................................... 250/396 R; 315/17
[58] Field of Search ............. 250/492.21, 398, 396 R; 313/359.1, 361.1, 363.1; 315/17

[56] References Cited

U.S. PATENT DOCUMENTS

| | | | |
|---|---|---|---|
| 3,096,437 | 7/1963 | Muray | 250/286 |
| 3,164,718 | 1/1965 | King | 250/290 |
| 3,600,573 | 8/1971 | Watanabe | 250/286 |
| 3,896,331 | 7/1975 | Enck | 315/17 |
| 3,970,854 | 7/1976 | Boroffka et al. | 250/492.21 |
| 4,439,685 | 3/1984 | Plies | 250/398 |
| 4,454,453 | 6/1984 | Sugawara | 315/101 |
| 4,503,329 | 3/1985 | Yamaguchi et al. | 250/309 |
| 4,713,543 | 12/1987 | Feuerbaum et al. | 250/309 |

FOREIGN PATENT DOCUMENTS 0095969 5/1983 European Pat. Off. .
0086431 7/1983 European Pat. Off. .

OTHER PUBLICATIONS

Journal of Electron Microscopy, vol. 32, No. 4, 1983, pp. 299, 304, Tokyo, JP; A. Takaoka et al.: "Stroboscopic TEM resolutation of 30 mus."
Journal of Vacuum Science & Technology B, vol. 4, No. 1, Jan.-Feb. 1986, pp. 116-119.

Primary Examiner—Bruce C. Anderson
Attorney, Agent, or Firm—Handal & Morofsky

[57] ABSTRACT

An electrical particle gun with applications in electronic and ionic microlithography for the integrated circuits industry comprises an emission chamber. In the emission chamber are a source adapted to emit the particles and devices for accelerating and focussing the particles. An exciter circuit is electrically connected to a decelerator electrode adjacent the focussing device. This enables pulsed emission of particles with an energy level lying within a predetermined band and filtering of the particles according to their energy level.

14 Claims, 4 Drawing Sheets

ELECTRICAL PARTICLE GUN

BACKGROUND OF THE INVENTION

1. Field of the invention

The present invention relates to an electrical particle gun enabling pulsed beams of particles to be generated and filtered according to their energy level.

2. Description of the prior art

Current electronic or ionic microlithographic techniques use pulsed electron or ion beams to etch circuits according to a reference design or diagram. For testing the circuits obtained in this way the particle beam has to be a pulsed beam with a high repetition frequency. Such pulsed beams are obtained by means of systems enabling transmission of the particle beam to be blocked or authorized. Currently used systems employ capacitor plates, resonant cavities or unipotential electrostatic lenses. Systems involving the use of unipotential electrostatic lenses are covered by publications including U.S. Pat. No. 4,439,685. In this system the unipotential lens is disposed after a first focussing lens of the focussing optical column held at the reference potential, so that the unipotential lens is totally separated from the source of electrical particles.

An object of the present invention is to provide a multifunction electrical particle gun enabling pulsed beams of electrical particles to be generated with a very high switching frequency.

Another object of the present invention is to provide an electrical particle gun enabling these electrical particles to be filtered according to their energy level to obtain a beam with reduced energy spread and/or pulsed emission at high switching frequencies.

A further object of the present invention is to provide an electrical particle gun that can be integrated into multistage accelerator systems.

SUMMARY OF THE INVENTION

The present invention consists in an electrical particle gun comprising an emission chamber and, in said emission chamber, a source adapted to emit said particles, devices for accelerating and focussing said particles, a decelerator electrode adjacent said focussing device, an exciter circuit and an electrical connection between said decelerator electrode and said exciter circuit, enabling pulsed emission of said particles with an energy level lying within a predetermined band and filtering of said particles according to their energy level.

The invention finds an application in electron or ion microlithography in the integrated circuit industry.

It will be better understood from the following description given by way of non-limiting example only with reference to the appended drawings.

DESCRIPTION OF THE PREFERRED EMBODIMENTS

Figure 1A:
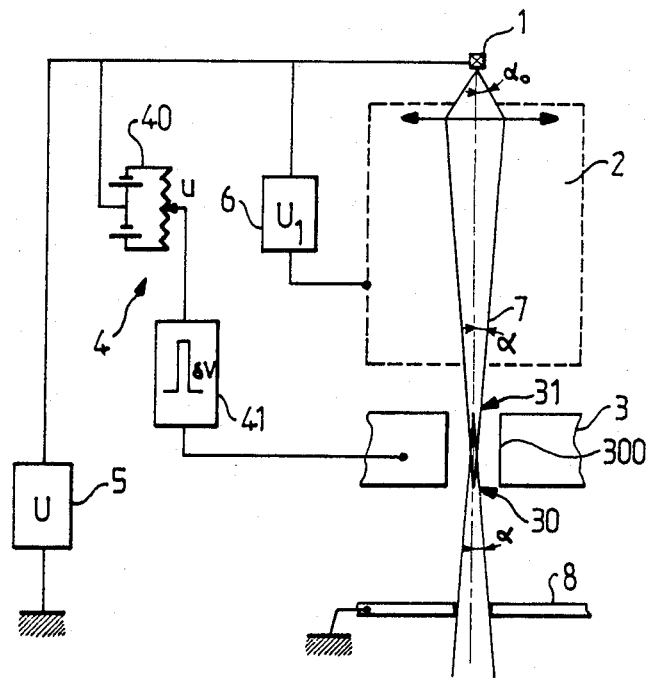
FIGS. 1a and 1b are block diagrams of electrical particle guns in accordance with the present invention.

Referring to FIG. 1a, the electrical particle gun in accordance with the invention comprises, within an emission chamber that is not shown in the figure, a source 1 emitting electrical particles and devices 2 for accelerating and focussing these particles.

In the vicinity of the focussing device 2 is a decelerator electrode 3, electrically connected to an exciter circuit 4 and enabling the pulsed emission of particles with energy levels within a predetermined energy band and filtering of the latter according to their energy level.

In accordance with the invention, the circuit 4 serves to apply to the decelerator electrode 3 an excitation signal consisting of a DC voltage of predetermined level, denoted u, on which is superimposed a pulse or a stream of pulses of amplitude $\delta V$ serving to block the particles.

The term electrical particle gun means an electron gun in the case where the electrical particles emitted are electrons or an ion gun in the case where the electrical particles emitted are positively or negatively charged ions. In the case of an electron gun the emission chamber is an electronic vacuum chamber, in the known way, whereas in the case of an ion gun the emission chamber may comprise a vacuum chamber in the case where the ion gun emits ions by virtue of field emission from a metal deposited on the cathode of the source or a chamber into which a gas to be ionized is introduced. A more detailed description of electron or ion gun structures that may be used will be given later in the present description.

In the first embodiment as shown in FIG. 1a, the excitation circuit 4 comprises, connected in cascade, a variable DC voltage generator 40 producing a bias voltage u relative to the reference voltage and a pulse generator 41 delivering one or more pulses of amplitude $\delta V$.

Figure 1B:
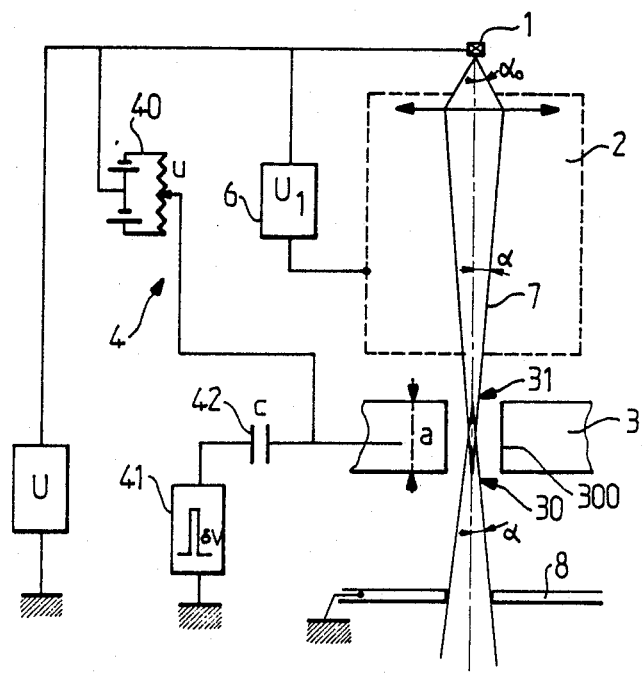

In a second embodiment of the excitation circuit 4, as shown in FIG. 1b, the circuit comprises a generator 40 producing a variable DC voltage u connected to the decelerator electrode 3 and a pulse generator delivering pulses of amplitude $\delta V$ connected to the decelerator electrode 3 by a capacitive device 42.

In the case where the electrical particles emitted are negatively charged, as in the case of emission of electrons, the emission source 1 is negatively biased to a value U relative to the reference voltage. The source 1 is positively biased to a value U relative to the reference voltage in the case where the particles emitted are positively charged. The voltage U is produced by a conventional type DC generator and typical values of the bias voltage U can be as high as several tens of kilovolts relative to the reference voltage.

The particle accelerator and focussing devices 2 consisting of an accelerator lens 2 are arranged in such a way that the accelerator lens 2 is biased positively by means of a DC generator producing a voltage U1 relative to the reference voltage in the case of emission of negatively charged electrical particles. The accelerator lens 2 is negatively biased by the aforementioned DC generator 6 to the value U1 relative to the reference voltage in the case of emission of positively charged electrical particles.

In accordance with the present invention, the decelerator electrode 3 is biased relative to the emission source 1 to a low DC voltage of between zero and a few volts, negative or positive according to whether the particles emitted are negatively or positively charged.

Operation of the electrical particle gun in accordance with the invention will now be described with reference to FIG. 2.

Figure 2:
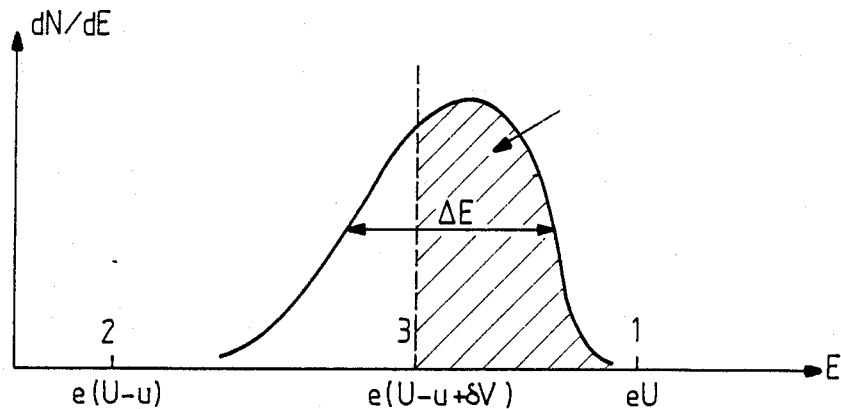
FIG. 2 is a graph showing the energy of electrical particles as a function of the electrode potentials of the gun in accordance with the invention, this diagram explaining the operation of the particle gun in accordance with the invention as shown in FIGS. 1a and 1b.

FIG. 2 is a graph showing the distribution of the number of electrical particles emitted, or of the derivative of this number, as a function of the acceleration energy of the electrical particles in the gun. The curve shown in FIG. 2 is representative of the energy spectrum of the electrical particles contained in the particle beam shown at 7 in FIG. 1a and 1b for an acceleration voltage U delivered by the DC generator 5 relative to one or more accelerator anodes schematically represented at 8 in FIGS. 1a and 1b.

In the case where the decelerator electrode 3 is biased to a potential U, the corresponding energy level being denoted eU (at 1 on the graph), it is assumed that all the electrical particles emitted by the emission source 1 pass through the decelerator electrode 3 and reach the anode or anodes 8. In this case all the particles which have an energy E greater (in absolute value) than eU can pass through the decelerator electrode. It will be understood that in the case of negatively charged particles or electrons the energy E is lower in value and in sign than the value eU where e designates the unit charge of the electron in value and in sign, whereas in the case of positive electrical particles the energy E is greater than the value eU.

In the case where a voltage u is superimposed by means of the DC voltage generator 40, for example, the relative energy level of the decelerator electrode 3 relative to the energy levels of the particles in the beam is held at a value e(U−u) corresponding to the point marked 2 in FIG. 2. In this case the relative energy level of the decelerator electrode 3 is greater (in absolute value) than the energy levels of the particles contained in the particle beam 7, the latter being blocked by the decelerator electrode 3.

In the case where a pulse of amplitude δV is superimposed on the voltage u delivered by the DC voltage generator 40, the relative energy level of the decelerator electrode 3 when the applied pulse is present becomes e(U−u+V) and correponds to point 3 in FIG. 2 conditioned by the amplitude δV of the pulses. In this latter case all the electrical particles of higher energy (in absolute value) than the relative energy of the decelerator electrode 3 corresponding to point 3 in FIG. 2 will be transmitted by the decelerator electrode 3 for the duration of the pulse whereas all other electrical particles, the energy of which is lower (in absolute value) than the relative energy level of the decelerator electrode 3 when pulses are present, that is the level e(U−u+V), will be blocked by the decelerator electrode 3. In FIG. 2 the electrical particles blocked are shown by the shaded part in the case where the electrical particles emitted are electrons and where the voltage u generated by the DC voltage generator 40 is a negative voltage.

For optimum operation of the electrical particle gun in accordance with the invention, in particular with regard to chromatic aberration, the various component parts of the particle gun as shown in FIGS. 1a and 1b may be arranged in such a way that the particle beam 7 enters the decelerator electrode 3 with a focussing half-angle $\alpha$ in a ratio of less than 1/5 to the emission half-angle $\alpha 0$ of the particles at the point of entry to the accelerator lens 2. The source 1 and the decelerator electrode 3 will accordingly be positioned allowing for the operating parameters of the accelerator lens 2 in such a way as to achieve this result.

The particle beam 7 may advantageously be focussed by the accelerator lens 2 at the object nodal point 30 of the decelerator electrode 3 so that the beam of particles emerging from the latter appears to issue from the image nodal point 31 of the decelerator electrode 3. The angle of emergence of the beam is then equal to the angle of entry at the decelerator electrode 3. The object nodal point of the decelerator electrode 3 is substantially at the center thereof.

The conditions covering focussing of the particle beam as previously described make it possible to minimize chromatic aberration. It is to be understood that these conditions are not limiting and that it is possible to depart slightly from the aforementioned operating conditions, although a particle beam of reduced quality is then obtained.

It is to be understood that to obtain minimum chromatic aberration the accelerator lens 2 must be itself constructed so as to feature low spherical and chromatic aberration. This condition will be met in the case where the lens has a short focal length, which implies that the particle source 1 must normally be situated in the vicinity of the optical center of the accelerator lens 2.

In accordance with the invention the decelerator electrode 3 must make it possible to establish on the optical axis near the center of the decelerator electrode a potential differing by at most a few volts from the potential at which the decelerator electrode 3 is held by the exciter circuit 4 according to the amplitudes u of the DC voltage and δV of the pulses to which the decelerator electrode 3 is subjected.

The decelerator electrode 3 may advantageously be a pierced electrode, the orifice 300 being substantially symmetrical relative to the optical axis. The orifice 300 advantageously has a diameter $\phi$ when the electrode has a thickness a such that the following relation is satisfied: $\phi \leq /a \leq 3/5$. The previously stated condition relating to the dimensions of the orifice and the electrode makes it possible to obtain the previously defined potential conditions substantially at the center thereof.

To enable use of the electrical particle gun in accordance with the invention with control pulses having very short switching times, below one nanosecond, in order to enable use of the electron gun in accordance with the invention in switching mode at very high switching frequencies, that is several hundred megahertz, it is advantageous to arrange the decelerator electrode and the other electrodes of the electron gun, and in particular the accelerator electrodes 2, in such a way that the stray or electrostatic capacitance between the decelerator electrode 3 and the other electrodes of the electron gun is minimized. This makes it possible to use switching pulses of very short duration and even pulse streams with a very high repetition frequency.

To obtain a decelerator electrode 3 of low electrostatic capacitance the aforementioned electrode may advantageously have a reduced cross-section as compared with the other electrodes of the gun. Also, the distance between the decelerator electrode 3 and the other electrodes may be increased, the only constraint relative to increasing this distance, which implies consequential focussing of the particle beam 7, being that it increases the overall size of the electrical particle gun. The distance between the decelerator electrode 3 and the other electrodes is typically one centimeter, for example.

Various embodiments of an electrical particle gun in the case where the particles emitted are negatively charged, the gun constituting an electron gun, will now be described with reference to FIGS. 3, 4 and 5.

Figure 3:
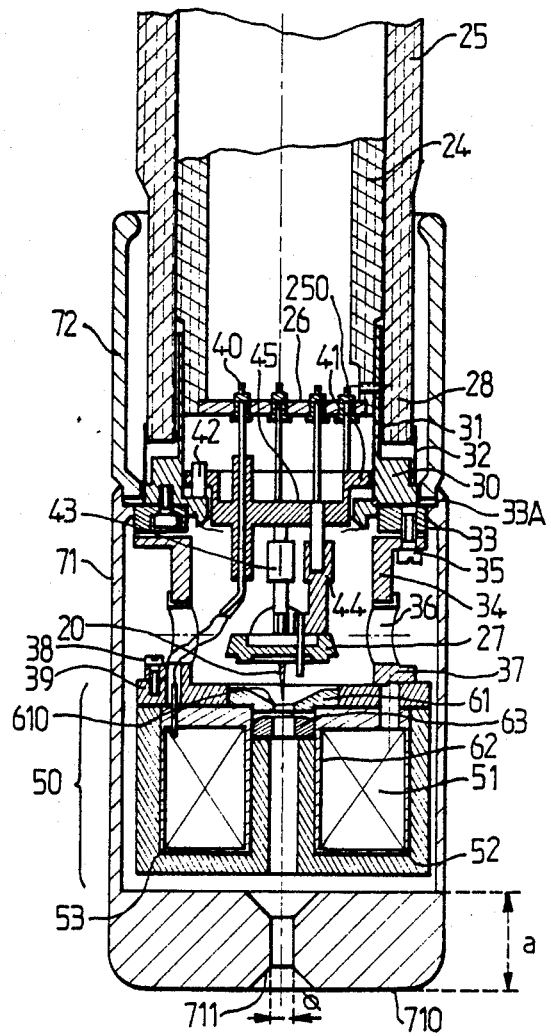
FIG. 3 shows a field emission electron gun in accordance with the present invention, the particles emitted being electrons.
Figure 4:
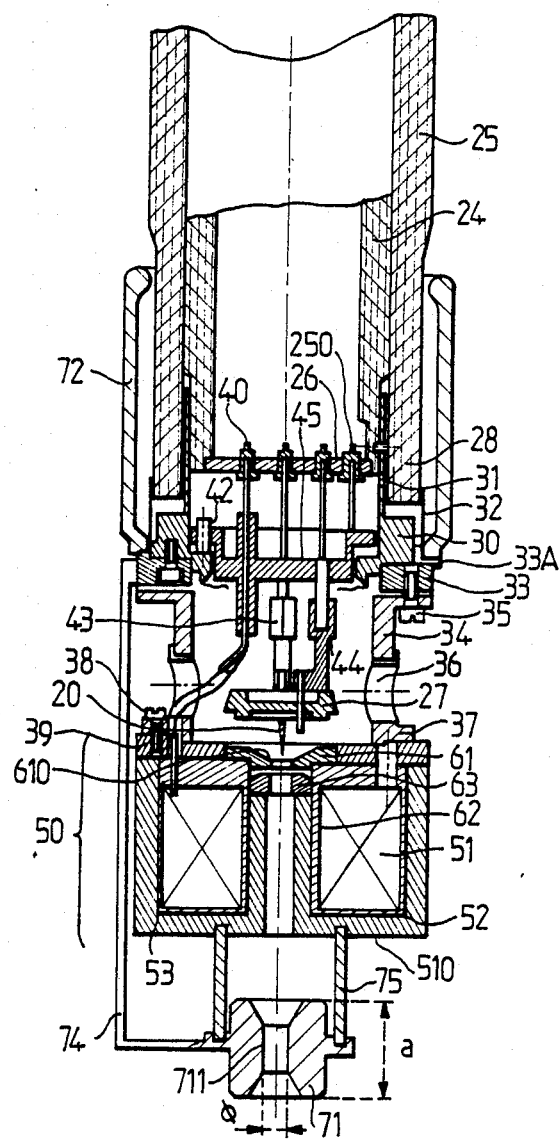
FIG. 4 shows a particularly advantageous embodiment of an electrical particle gun in accordance with the present invention in the case where, the particles emitted being electrons, a very high switching frequency can be achieved by virtue of the very low electrostatic capacitance obtained between the electrodes.

In FIGS. 3 and 4 the various components of the electron gun in accordance with the present invention from figures 1a and 1b, with the exception of the decelerator electrode 3, are very similar to the components of the electron gun described in published European Patent Application No. 0 095 969 of Dec. 7, 1983. For a description of the arrangement of the various components constituting the electron gun shown in FIGS. 3 and 4 in particular reference may be had to the text of the aforementioned European patent application. A parts list of the various components referenced in FIGS. 3 and 4 appears at the end of this description.

Referring to FIG. 3, the electron gun in accordance with the invention comprises a magnetic lens 50 constituting the accelerator lens 2. With regard to the operating conditions of the electromagnetic lens 50, these correspond to the operating conditions described in the aforementioned European patent application, the magnetic lens 50 constituting a lens of short focal length.

As seen in FIG. 3, the decelerator electrode may consist of an electrode denoted 71 comprising a hollow electrode body substantially enclosing the magnetic lens 50. The decelerator electrode 71 has an outlet face 710 facing the magnetic lens 50 in which is an outlet orifice 711 disposed substantially on the optical axis. It is to be understood that the decelerator electrode 71 meets (in terms of its geometrical construction parameters relative to its thickness a and the diameter $\phi$ of the orifice 711) the condition whereby it is possible to obtain on the optical axis a potential within a few volts of the potential of the source 1, as previously defined. It is seen in FIG. 3 that the orifice 711 is flared at its ends. In this, optional case the thickness a of the electrode is to be understood as including these flared portions, this thickness having to be great enough to meet the previously defined conditions in respect of the potential at the center of the orifice 711 on the optical axis.

In accordance with the invention, the decelerator electrode 71 is connected to the excitation generator 4 through the intermediary of the high-tension lead-through 25 and a supplementary electrical contact 250.

An alternative embodiment in which the decelerator electrode has a low electrostatic capacitance relative to the magnetic lens 51 will now be described with reference to FIG. 4.

In this figure the decelerator electrode 71 may advantageously be of reduced cross-section relative to the magnetic lens 50. It may advantageously be mounted on insulative spacers or rods 75 bearing against the corresponding surface 510 of the magnetic lens. The insulative spacers 74 may advantageously be made from a material such as alumina.

The electrical connection between the decelerator electrode 71 and the excitation generator 4 may advantageously be provided, as shown in FIG. 4, by a rigid conductor 74 connecting the electrode to the ring or shoulder 33, 33a.

The FIG. 4 embodiment makes it possible to obtain a decelerator electrode whose stray electrostatic capacitance relative to the magnetic lens 51 is in the order of one picofarad.

The connection of the ring 33 to the excitation generator 4 may advantageously be made by a cable entering the high-tension lead-through 25 and connected to the part 41 which is in turn connected to the decelerator electrode 71.

Another embodiment of the electrical particle gun in accordance with the invention will now be described with reference to FIG. 5.

In the embodiment shown in this figure the electrical particle gun may advantageously provide for the emission of electrons or even of ions, depending on the emission mode chosen. In FIG. 5 the magnetic lens 51 previously employed is replaced by an electrostatic lens consisting of the parts denoted 76, 77, 78 and 79. The electrostatic lens constitutes a unipotential electrostatic lens of which the first electrode 76 and third electrode 78 are held at the potential required to extract the particles from the emission source while, the second electrode 77 is held at a different potential serving to vary the focussing properties of the lens.

Figure 5:
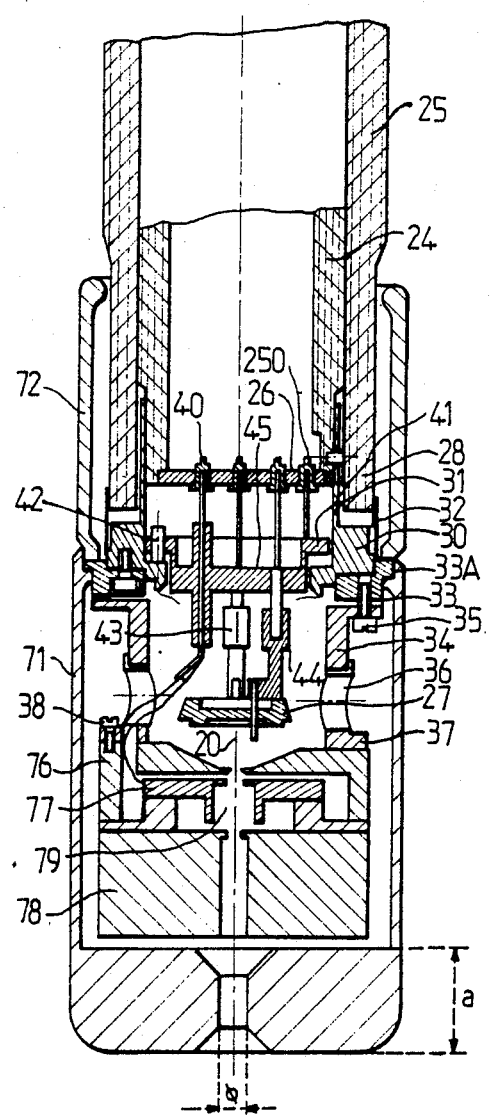
FIG. 5 shows an alternative embodiment of the electrical particle gun from FIG. 3 in which the accelerator device comprises an electrostatic lens.

By virtue of an advantageous characteristic of the FIG. 5 embodiment, and with a view to obtaining a high performance particle gun from the point of view of spherical and chromatic aberration, the lens may be an assymetric type lens. In this case the orifice of the second electrode 79 would be nearer the first electrode 76 than the third electrode 78. Moreover, for this lens to function with a short focal distance the first electrode 76 would be placed near the source, preferably at a distance of a few millimeters. Given these conditions, the spherical and chromatic aberration coefficients of the lens would be in the order of a few centimeters.

The FIG. 5 embodiment is not limited to the implementation of an electron gun, of course. To the contrary, this embodiment advantageously lends itself to the implementation of a field emission ion gun. For a more detailed description of the operating conditions of a gaseous ion gun such as that previously mentioned reference may usefully be had to a paper by W. H. ESCOVITZ, T. R. FOX and R. LEVI-SETTI entitled Scanning Transmission Ion Microscope with a Field Ion Source, published in Pro. Nat. Acad. Sci. USA, Vol. 72, No. 5, pp–1826, 1828, May 1985.

There has been described an electrical particle gun enabling pulsed emission of particles having energy levels within a predetermined energy band.

The electrical particle gun in accordance with the invention is particularly remarkable in that it is designed and adapted through the use of a particularly simple design of decelerator electrode to control or switch the particle beam "at source", that is to say in the vicinity of the source, where the particles of the beam still have a low acceleration energy level. It is advantageously distinguished from the prior art devices in that it makes it possible, especially where the particle gun is a field emission gun and the particles emitted are electrons, to eliminate one focussing lens from the focussing column.

The electrical particle gun in accordance with the invention is not limited to field emission guns, of course;

specifically, it encompasses conventional electron and ion guns. The aforementioned elimination of the focussing lens consequently makes it possible to reduce the length of the particle trajectory and thus to attenuate effects which tend to increase the dimension of the probe or the section of the beam in the scanning plane. An increased scanning spatial resolution is thus obtained.

Parts list of the most important parts shown in FIGS. 3, 4 and 5:

24 polmethylmethacrylate sleeve
25 alumina insulative sheath - high-tension leadthrough
26 homologous disk
27 base support
28 electrical lead-through
30 annular shape device
31 ring
33 ring
33A outside shoulder
34 alumina cylinder
35 screw
37 magnetic focussing device support member
38 retaining screw
39 metal plate
40 electrical lead-through
41 inner ring
42 screw
43 lead-through members
44 lead-through members
45 insulative disk
50 magnetic lens
51 coil
52 sealed carcasse
53 magnetic circuit
60 polepiece
61 polepiece first part
62 polepiece second part
63 spacer
72 part of intermediate electrode
250 electrical contact
610 upper hole
620 lower hole

I claim:

1. An electrical particle gun, comprising:
   (a) an emission chamber;
   (b) a source disposed in the said emission chamber for emitting particles;
   (c) a device for accelerating said particles
   (d) a device for focusing said particles;
   (e) a decelerator electrode adjacent said focusing device;
   (f) an exciter circuit; and
   (g) an electrical connection between said decelerator electrode and said exciter circuit, enabling pulsed emission of said particles at said source with an energy level lying within a predetermined band and filtering of said particles according to their energy level.

2. A particle gun according to claim 1, wherein said exciter circuit applies an excitation signal to said decelerator electrode, said excitation signal comprising a DC voltage of predetermined level on which is superimposed a stream of pulses having an amplitude enabling blocking of said particles.

3. A particle gun according to cliam 1, wherein said exciter circuit comprises a variable DC voltage generator and a pulse generator connected in cascade.

4. A particle gun according to claim 1, wherein said exciter circuit comprises a variable DC voltage generator connected to said decelerator electrode, and wherein a pulse generator is connected to said decelerator electrode.

5. A particle gun according to claim 1, wherein when said particles are negatively charged, said source is negatively biased relative to said reference voltage and, when said particles are negatively charged, said source is positively biased relative to said reference voltage.

6. A particle gun according to claim 1, wherein said accelerator lens is positively biased relative to said reference voltage when said particles are negatively charged and negatively biased relative to said reference voltage when said particles are positively charged.

7. A particle gun according to claim 1, wherein said decelerator electrode is positively or negatively biased, depending on whether said particles are positively or negatively charged, to a low voltage relative to said source whereby particles having an energy level less in absolute value than a corresponding energy level can be blocked.

8. A particle gun according to claim 1, wherein said particle beam is adapted to enter said decelerator electrode at a focusing half-angle which is less than one-fifth of the emission half-angle of the particles on entering said accelerator lens.

9. A particle gun according to claim 1, wherein said particle beam is focused by said accelerator lens at the object nodal point of said decelerator electrode whereby the emergent particle beam appears to issue from the image nodal point of said decelerator electrode.

10. A particle gun according to claim 1, wherein said decelerator electrode is of reduced capacitance whereby a decelerator electrode with low electrostatic capacitance is obtained, said decelerator electrode is of reduced cross-section relative to the other electrodes of said gun and the distance between said decelerator electrode and said other electrodes is on the order of one centimeter.

11. A particle gun according to claim 1, wherein said particles are electrons and said gun comprises:
   (h) a magnetic lens forming a short focal length accelerator lens, and
   (i) a decelerator lens formed by a hollow electrode body substantially enclosing said magnetic lens and having an outlet surface, an outlet orifice disposed in said outlet surface and substantially on the optical axis, the potential on said optical axis being near the potential of said source in the absence of signals delivered by said exciter circuit.

12. A particle gun according to claim 11, wherein said decelertaor electrode comprises an element of reduced cross-section relative to said magnetic lens mounted on insulative spacers, said spacers bearing against a corresponding surface of said magnetic lens.

13. A particle gun according to claim 1, wherein said particles are electrons and said gun comprises:
   (h) an electrostatic lens forming a short focal length accelerator lens, and
   (i) a decelerator lens formed by a hollow electrode body substantially enclosing said electrostatic lens and having facing said electrostatic lens an outlet surface defining an outlet orifice disposed substantially on the optical axis, the potential on said optical axis being near the potential of said source in the absence of signals delivered by said exciter circuit, and wherein said decelerator electrode comprises an element of reduced cross-section relative to that of said electrostatic lens mounted on insulative spacers bearing against a corresponding surface of said electrostatic lens.

14. Electrical particle gun comprising an emission chamber and, in said emission chamber, a source for emitting electrical particles, devices for accelerating and focusing said particles, a decelerator electrode adjacent said focusing device, and exicter circuit and an electrical connection between said decelerator electrode and said exciter circuit, enabling pulsed emission of said particles at said source with an energy level lying within a predetermined band and filtering of said particles according to their energy level, wherein said particle beam is focused by said accelerator lens at the object nodal point of said decelerator electrode whereby the emergent particle beam appears to issue from the image nodal point of said decelerator electrode.

* * * * *